(12) United States Patent
Mizuno et al.

(10) Patent No.: US 10,628,349 B2
(45) Date of Patent: Apr. 21, 2020

(54) I/O CONTROL METHOD AND I/O CONTROL SYSTEM

(71) Applicant: HITACHI, LTD., Tokyo (JP)

(72) Inventors: Kazuhiko Mizuno, Tokyo (JP); Ken Sugimoto, Tokyo (JP); Hiroaki Akutsu, Tokyo (JP); Naoya Okada, Tokyo (JP); Keitaro Uehara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/333,756

(22) PCT Filed: Mar. 24, 2017

(86) PCT No.: PCT/JP2017/012194
§ 371 (c)(1),
(2) Date: Mar. 15, 2019

(87) PCT Pub. No.: WO2018/173300
PCT Pub. Date: Sep. 27, 2018

(65) Prior Publication Data
US 2019/0361824 A1 Nov. 28, 2019

(51) Int. Cl.
G06F 13/20 (2006.01)
G06F 9/455 (2018.01)
H03M 13/15 (2006.01)

(52) U.S. Cl.
CPC .......... G06F 13/20 (2013.01); G06F 9/45558 (2013.01); H03M 13/154 (2013.01); *G06F 2009/45579* (2013.01)

(58) Field of Classification Search
CPC ................. H03M 13/154; G06F 13/20
See application file for complete search history.

(56) References Cited

U.S. PATENT DOCUMENTS 8,775,774 B2 * 7/2014 Desai ................ G06F 3/0604
711/203
9,792,231 B1 * 10/2017 Thompson .......... G06F 13/1642
(Continued)

FOREIGN PATENT DOCUMENTS

JP 2017-010102 A 2/2017
WO 2016/052665 A1 4/2016

OTHER PUBLICATIONS

International Search Report for PCT/JP2017/012194, dated Jun. 27, 2017.

*Primary Examiner* — Farley Abad
(74) *Attorney, Agent, or Firm* — Volpe and Koenig, P.C.

(57) ABSTRACT

An I/O control method and system for respectively achieving both acceleration of I/O processing and redundantization of data. The present invention is based upon an I/O control method of performing control related to an I/O request from a virtual machine operated in a computer provided with an I/O device that executes I/O processing, and the I/O control method includes a first step in which an I/O analysis unit determines whether or not data redundantization processing related to the I/O request is executed on the basis of the I/O request from the virtual machine and setting information for enabling identifying whether or not the data redundantization processing is executed and a second step in which a control unit transmits an I/O command related to the I/O request to a data redundantization mechanism that executes the data redundantization processing on the basis of a determination result in the first step.

10 Claims, 14 Drawing Sheets

| NODE# | VM# | HOST MEMORY ADDRESS | DATA ACCESS METHOD | DATA PATH | EC FLAG |
|---|---|---|---|---|---|
| NODE#1 | VM#1 | 0X0004 –0X0008 | OBJECTE | /dev/ecpool0 | 1 |
| | VM#2 | 0X0008 –0X000C | BLOCK DEVICE | /dev/normal0 | 0 |
| | VM#3 | 0X0010 –0X0014 | FILE SYSTEM | /dev/ecpool0 | 1 |
| | : | : | : | : | : |
| : | : | : | : | : | : |

401 402 403 404 405 406

204

(56) References Cited

U.S. PATENT DOCUMENTS

2011/0029840 A1* 2/2011 Ozzie .................. G06F 11/1004
714/763
2016/0371145 A1 12/2016 Akutsu et al.

* cited by examiner

FIG. 3

| NODE# | VM# | HOST MEMORY ADDRESS | GUEST MEMORY ADDRESS | DATA STORED AREA |
|---|---|---|---|---|
| NODE#1 | VM#1 | 0x0004 –0x0008 | 0x000a –0x000e | FLASH#1 |
| | VM#2 | 0x0008 –0x000c | 0x000f –0x0014 | FLASH#1 |
| .. | .. | .. | .. | .. |

| NODE# | VM# | HOST MEMORY ADDRESS | DATA ACCESS METHOD | DATA PATH | EC FLAG |
|---|---|---|---|---|---|
| NODE#1 | VM#1 | 0X0004 –0X0008 | OBJECTE | /dev/ecpool0 | 1 |
| | VM#2 | 0X0008 –0X000C | BLOCK DEVICE | /dev/normal0 | 0 |
| | VM#3 | 0X0010 –0X0014 | FILE SYSTEM | /dev/ecpool0 | 1 |
| .. | .. | .. | .. | .. | .. |

VIRTUAL SERVER SETTING SCREEN 1400

- VM NAME: AAA
- NUMBER OF CPU CORES: 3
- MEMORY CAPACITY: 50

DEVICE ALLOCATION:
- /dev/sda — DEVICE NAME: /dev/ecpool0
- /dev/sdb — DEVICE NAME: /dev/normal0
- ＋ ADD DEVICE

EC EXECUTION CONDITION: ☑ USE EC

ACCESS METHOD
- ☑ : Object
- ☑ : Block
- ☐ : File System

DATA PATH
- ☑ : /dev/ecpool**
- ☐ : /dev/normal**

I/O CONTROL METHOD AND I/O CONTROL SYSTEM

TECHNICAL FIELD

The present invention relates to an I/O control method and an I/O control system, for example, the present invention is suitable for applying to an I/O control method and an I/O control system for control related to an I/O request of a virtual machine operated in a computer provided with an I/O device that executes I/O processing.

BACKGROUND ART

Recently, according to sophistication of an intra-company IT system, data volume stored and managed by a company dramatically increases. Each primary IT vendor provides an integration platform that vertically integrates all including hardware and an OS (Operating System) so as to swiftly and efficiently install a system that processes a variety of mass data.

Out of the integration platforms, Hyper Converged PF (platform) that installs the following software in a physical server after a server function and a storage function are loaded into the software and that allocates resources to each server, if necessary, attracts attention. This Hyper-Converged Platform enables greatly increasing storage capacity by using a low-cost 2U server for example and scaling out it.

According to an integration platform such as the abovementioned Hyper Converged Platform, as resources required when a virtual server is operated on this platform for example can be easily allocated because a server and a storage are integrally managed by software, the performance can be enhanced by scaling out and further higher agility can be provided.

In addition, in a storage system, research of Multi-stage Erasure Coding that redundantizes data is advanced and technique for achieving both high capacity efficiency and high reliability is disclosed (refer to Patent Literature 1).

CITATION LIST

Patent Literature

Patent Literature 1: WO 2016/052665

SUMMARY OF INVENTION

Technical Problem

In virtual environment such as a KVM (Kernel-based Virtual Machine), flexible control over I/O processing by emulation processing and others, for example, a link with EC (Erasure Coding) is possible; however, in such I/O processing, storage processing for input and output is operated in a server and I/O performance may be greatly deteriorated because of an overhead of virtualization by a VMM (Virtual Machine Monitor).

In this regard, SR-IOV (Single Root I/O Virtualization) that omits processing of the VMM by off-loading I/O processing on the side of a NIC (Network Interface Card) and that instructs hardware to execute the I/O processing is known. However, as a VM (Virtual Machine) to which a VF (Virtual Function) of the NIC is allocated can only directly issue an I/O instruction to a volume of a Flash and others being a write destination, Patent Literature 1 has a problem that a link with a storage function such as the EC is impossible though the technique described in Patent Literature 1 is disclosed.

The present invention is made in view of the abovementioned problem and provides an I/O control method and an I/O control system respectively that inhibit an overhead of virtualization and that are linkable with a data redundantization mechanism such as EC.

Solution to Problem

To settle the abovementioned problem, the present invention is based upon an I/O control method of performing control related to an I/O request from a virtual machine operated in a computer provided with an I/O device for executing I/O processing, and has a characteristic that the I/O control method according to the present invention includes a first step in which an I/O analysis unit determines whether data redundantization processing related to an I/O request is executed or not on the basis of the I/O request from the virtual machine and setting information for enabling identifying whether the data redundantization processing is executed or not and a second step in which a control unit transmits an I/O command related to the I/O request to a data redundantization mechanism that executes the data redundantization processing on the basis of a determination result in the first step.

In addition, the present invention is based upon an I/O control system that performs control related an I/O request from a virtual machine operated in a computer provided with an I/O device for executing I/O processing, and has a characteristic that the I/O control system according to the present invention is provided with an I/O analysis unit that determines whether data redundantization processing related to an I/O request is executed or not on the basis of the I/O request from the virtual machine and setting information for enabling identifying whether the data redundantization processing is executed or not and a control unit that transmits an I/O command related to the I/O request to a data redundantization mechanism for executing the data redundantization processing on the basis of a determination result of the I/O analysis unit.

According to the present invention, as I/O processing is executed by the I/O device and data redundantization processing is executed on the basis of an I/O request from the virtual machine, an overhead of virtualization is inhibited and a link with the data redundantization mechanism is made possible.

Advantageous Effects of Invention

According to the present invention, the I/O control method and the I/O control system that respectively achieve both acceleration of I/O processing and redundantization of data can be realized.

BRIEF DESCRIPTION OF DRAWINGS

FIG. 3 shows one example of a data management table according to the first embodiment.

FIG. 4 shows one example of an EC utilization management table according to the first embodiment.

FIG. 14 shows one example of a management screen for managing configuration information of a virtual server and a utilization condition of EC according to the fifth embodiment.

DESCRIPTION OF EMBODIMENTS

Figure 1:
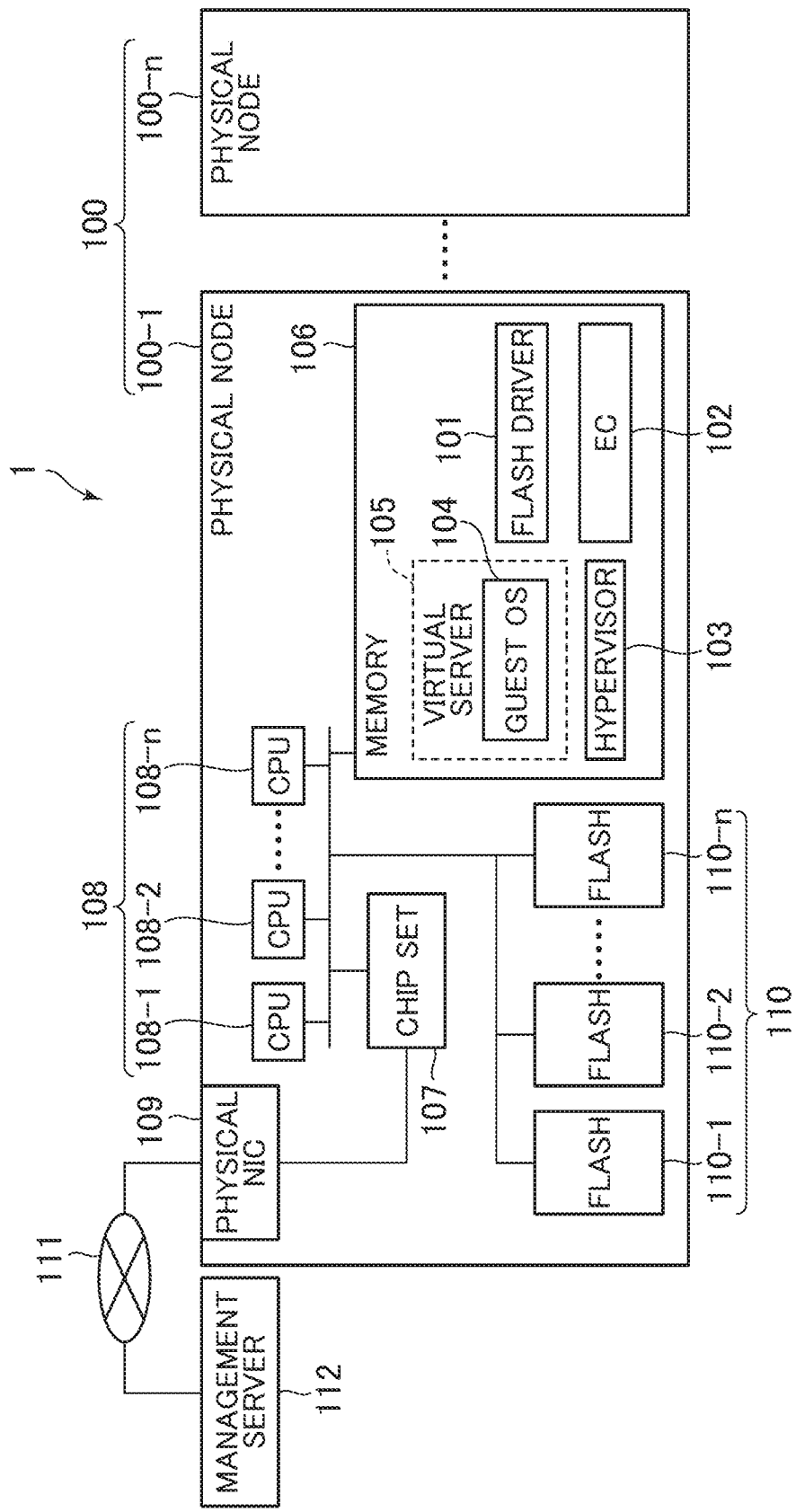
FIG. 1 shows a configuration example of an I/O control system according to a first embodiment.

Referring to the drawings, one embodiment of the present invention will be described in detail below.

In an I/O control system according to the following embodiments, a computer in which a server and a storage are integrated by virtualization software and a management device that manages setting information related to the computer are connected via a network.

A computer is provided with an I/O device (for example, NIC corresponding to SR-IOV) that has a PF (Physical Function) being a physical network device and a VF (Virtual Function) being a virtual network device and corresponding to the PF and that executes I/O processing.

In such a computer, processing of Hypervisor (VMM) is omitted in communication processing between a virtual machine (VM) and the VF (a storage device) and I/O processing is performed in the I/O device. In addition, it is determined based upon information for enabling determining propriety of execution of data redundantization processing (for example, EC processing) included in the setting information and an I/O request of the VM whether the data redundantization processing is executed or not, and data is suitably redundantized according to the I/O request (a backup copy is acquired).

According to such an I/O control system, an overhead by virtualization can be reduced by the I/O processing in the I/O device and the data redundantization processing can be suitably executed on the basis of an I/O request of the VM.

(1) First Embodiment

In FIG. 1, a reference numeral 1 denotes an I/O control system according to a first embodiment as a whole. In this I/O control system 1, a physical node 100 (a physical node 100-1 to a physical node 100-n in this embodiment) being a virtualization infrastructure (a hyper-converged infrastructure (HCI)) in which a server function and a storage function are integrated and a management server 112 are connected via a network 111. As the physical nodes 100-1 to 100-n have the same configuration, the physical node 100-1 will be described for an example below and description of the other physical nodes 100-2 to 100-n is omitted.

In the physical node 100-1, one or more central processing units (CPUs) 108 (CPU 108-1 to CPU 108-n in this embodiment), a memory 106, one or more flash memories (Flash 110-1 to Flash 110-n in this embodiment) 110 and physical NIC 109 are connected to Chip Set 107 that manages reception/transfer of data.

The CPU 108 is one example of a controller and executes various processing.

The memory 106 is one example of a storage device such as a RAM (Random Access Memory), and stores various programs, various tables and others. Flash Driver 101, EC 102, Hypervisor 103 and Guest OS 104 operated in a virtual server 105 controlled by the Hypervisor 103 are realized when the CPU 108 executes a program in the memory 106.

The Flash 110 is one example of a storage device and may also be an HDD (Hard Disk Drive) and others. For the storage device, a suitable configuration such as one storage device, plural storage devices, RAID (Redundant Arrays of Inexpensive Disks) including plural storage devices and plural RAIDs can be adopted.

The physical NIC 109 is provided with a function for supporting virtualization (for example, SR-IOV) and a device sharing process is installed in the physical NIC. More concretely, the physical NIC 109 is provided with PF equivalent to one physical NIC and VF equivalent to one or plural virtual NICs that communicates/communicate with an external device via the PF. Owing to such a configuration, the similar maximum band to that of the PF can be secured, compared with NIC sharing by software. In addition, as for a band, restriction (for example, in a unit of 100 Mbps) can be applied for every VF and resources can be securely allocated to a port requiring securement of performance. Further, as a load related to device sharing processing of the CPU 108 (the Hypervisor 103) can be zeroized, broadband communication is enabled.

According to such a configuration of the physical node 100-1, a virtual storage system for realizing a storage pool by one or plural storage devices of the physical node 100 for example can be realized.

The management server 112 manages setting information for performing various settings in each physical node 100. For example, the management server 112 inputs various setting information such as a set value on the basis of user operation and transmits the input setting information to each physical node 100. When each physical node 100 receives the setting information, it stores the information in a predetermined storage area of the memory 106. Transmission of the management server 112 can be made at suitable timing, may also be made at real time, may also be made periodically, may also be made at time specified by a user, and the transmission may also be made at the other timing.

Figure 2:
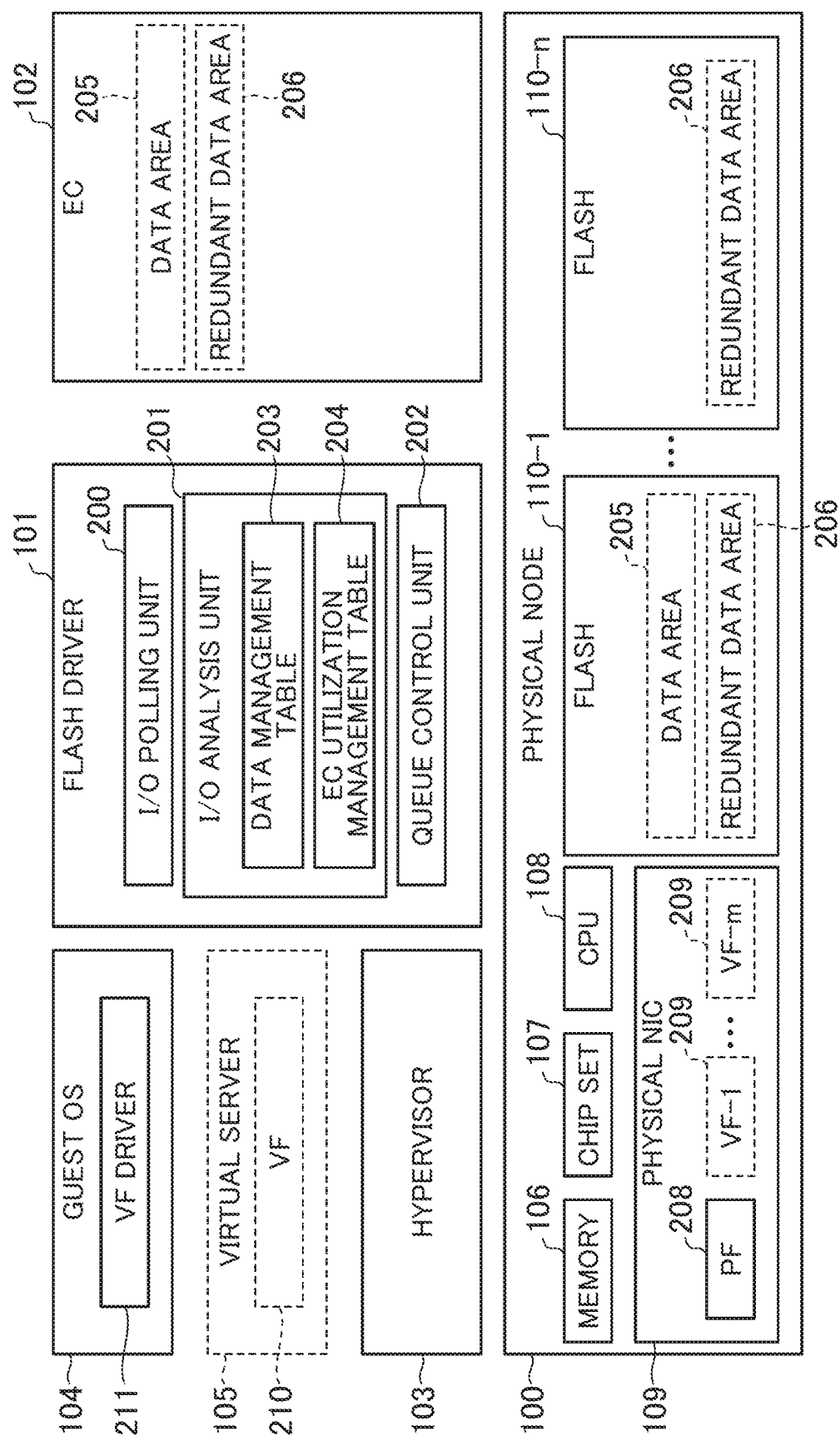
FIG. 2 shows one example of a stack configuration of software in a physical node according to the first embodiment.

FIG. 2 shows one example of a stack configuration of software in the physical node 100.

As shown in FIG. 2, in the physical node 100, the Hypervisor 103 is loaded into the memory 106 and the virtual server 105 is controlled by the Hypervisor 103. More concretely, the Hypervisor 103 is one example of a virtualization mechanism and allocates logical resources acquired by logically dividing hardware such as the CPU 108, the memory 106 and the physical NIC 109 to the virtual server 105 as virtual resources. Hereby, the virtual server 105 is realized.

VF 210 is allocated to the virtual server 105 corresponding to VF 209 (VF-1 to VF-m) logically partitioned in the physical NIC 109 and a VF driver 211 is installed in the Guest OS 104.

The Guest OS 104 recognizes virtual resources of the virtual server 105 as normal resources and is connected to the Flash 110, the network 111 and others for example via the VF 210. Additionally, when the Hypervisor 103 allocates resources of the VF 209 to the virtual server 105 as the VF 210, an I/O command is transmitted to the Flash 110 via the VF 210, the VF 209 and PF 208 (data is read/written from/to a data area 205) by the VF driver 211 provided to the Guest OS 104 in the virtual server 105 and communication with an external device is made.

In addition, the Flash Driver 101 is provided to the physical node 100. The Flash Driver 101 is provided with an I/O polling unit 200 that acquires an I/O request from the virtual server 105 by polling, an I/O analysis unit 201 that analyzes the I/O request acquired by the I/O polling unit 200 and a queue control unit 202 that controls a Write Queue on the basis of a result of analysis by the I/O analysis unit 201.

The I/O polling unit 200 monitors the PF 208 for managing the VF 209 and acquires an I/O request from the virtual server 105.

The I/O analysis unit 201 is provided with a data management table 203 that stores information for enabling specifying the Flash 110 being an input/output issuance destination and an EC utilization management table 204 that stores information for enabling determining whether EC processing is executed or not. The I/O analysis unit 201 analyzes the I/O request from the virtual server 105 on the basis of information in the data management table 203 and information in the EC utilization management table 204, and determines whether EC processing is executed or not. The data management table 203 will be described referring to FIG. 3 later and the EC utilization management table 204 will be described referring to FIG. 4 later.

The queue control unit 202 is one example of a controller, when it is determined by the I/O analysis unit 201 that EC processing is executed for example on the basis of a determination result by the I/O analysis unit 201, data related to the I/O request is stored in a queue (is queued) and is transmitted to the EC 102 at suitable timing.

Moreover, the EC 102 that executes EC processing is provided to the physical node 100. The EC 102 is one example of a data redundantization mechanism, generates parity from original data (stored in the data area 205) in EC processing and stores the generated parity and a fragment of the original data (hereinafter called redundantized data) in a state in which the parity and the redundantized data are distributed. More concretely, the EC 102 stores data (original data) transmitted from the queue control unit 202 in the data area 205 and stores redundantized data acquired by coding the data in a redundantized data area 206 in the predetermined Flash 110.

For example, when a write request is made as an I/O request in the virtual server 105 and it is determined that EC processing is executed, the VF 209 (the PF 208) transmits a write command for writing data to be written to the Flash 110 correlated with the virtual server 105 and the corresponding Flash 110 writes the data to be written in the data area 205. In the meantime, the EC 102 receives data including data in a write request at suitable timing from the queue control unit 202, generates redundantized data from the corresponding data, transmits a write command for writing the redundantized data to another Flash 110 different from the abovementioned Flash 110, and the other Flash 110 writes the redundantized data to the redundantized data area 206.

FIG. 3 shows one example of the data management table 203. The data management table 203 stores information which is input via an I/O device (not shown) such as a console of the physical node 100, the management server 112 and others and which enables specifying the Flash 110 being an issuance destination of an I/O request.

More concretely, in the data management table 203, respective information of a Node #301, a VM number 302, a Host memory address 303, a guest memory address 304 and a data stored area 305 is stored in a state in which each information in respective items is correlated. In a field of the Node #301, information for enabling identifying the physical node 100 is stored. In a field of the VM number 302, information for enabling identifying the virtual server 105 is stored. In a field of the Host memory address 303, information showing a Host memory address of the memory 106 viewed from the physical node 100 is stored. In a field of the guest memory address 304, information showing an address of a virtual memory (a memory area acquired by logically allocating the corresponding area to the virtual server 105 in the memory 106) viewed from the Guest OS 104 is stored. In a field of the data stored area 305, information for enabling identifying the Flash 110 having the data area 205 is stored. The abovementioned identifiable information may also be an arbitrary serial number and may also be a symbol and an identifier that can discriminate each.

FIG. 4 shows one example of the EC utilization management table 204. The EC utilization management table 204 stores information which is input via an I/O device (not shown) such as a console of the physical node 100, the management server 112 and others and which enables determining whether EC processing is executed or not.

More concretely, information of each item such as Node #401, VM #402, a Host Memory Address 403, a Data Access Method 404, a Data Path 405 and an EC Flag 406 is stored in the EC utilization management table 204 in a state in which each information are correlated. In a field of the Node #401, information for enabling identifying the physical node 100 is stored. In a field of the VM #402, information for enabling identifying the virtual server 105 is stored. In a field of the Host Memory Address 403, information showing a Host memory address viewed from the physical node 100 of the memory 106 is stored. In a field of the Data Access Method 404, information for enabling identifying a data access method is stored. In a field of the EC Flag 406, information showing whether EC processing is executed or not is stored. Identifiable information in this case may also be an arbitrary serial number and may also be a symbol and an identifier respectively for enabling discriminating each.

In this case, a configuration that information in the field of the EC Flag 406 is set corresponding to the virtual server 105 (VM #402), the Data Access Method 404 of the virtual server 105 and a file path (the Data Path 405) used by the virtual server 105 is shown; however, the present invention is not limited to this configuration. For example, the abovementioned information may also be set corresponding to the virtual server 105 (information in the fields of the Data Access Method 404 and the Data Path 405 is not required to be set). In addition, for example, the abovementioned information may also be set corresponding to the virtual server 105 and the data access method of the virtual server 105 (information in the field of the Data Path 405 is not required to be set). Moreover, for example, the abovementioned information may also be set corresponding to the virtual server 105 and a file path used by the virtual server 105 (information in the field of the Data Access Method 404 is not required to be set).

In this embodiment, for a data access method, "Object" that enables access in units of an object, "Block Device" that enables access in units of a block and "File System" that enables access in units of a file are given; however, another data access method may also be adopted.

Figure 5:
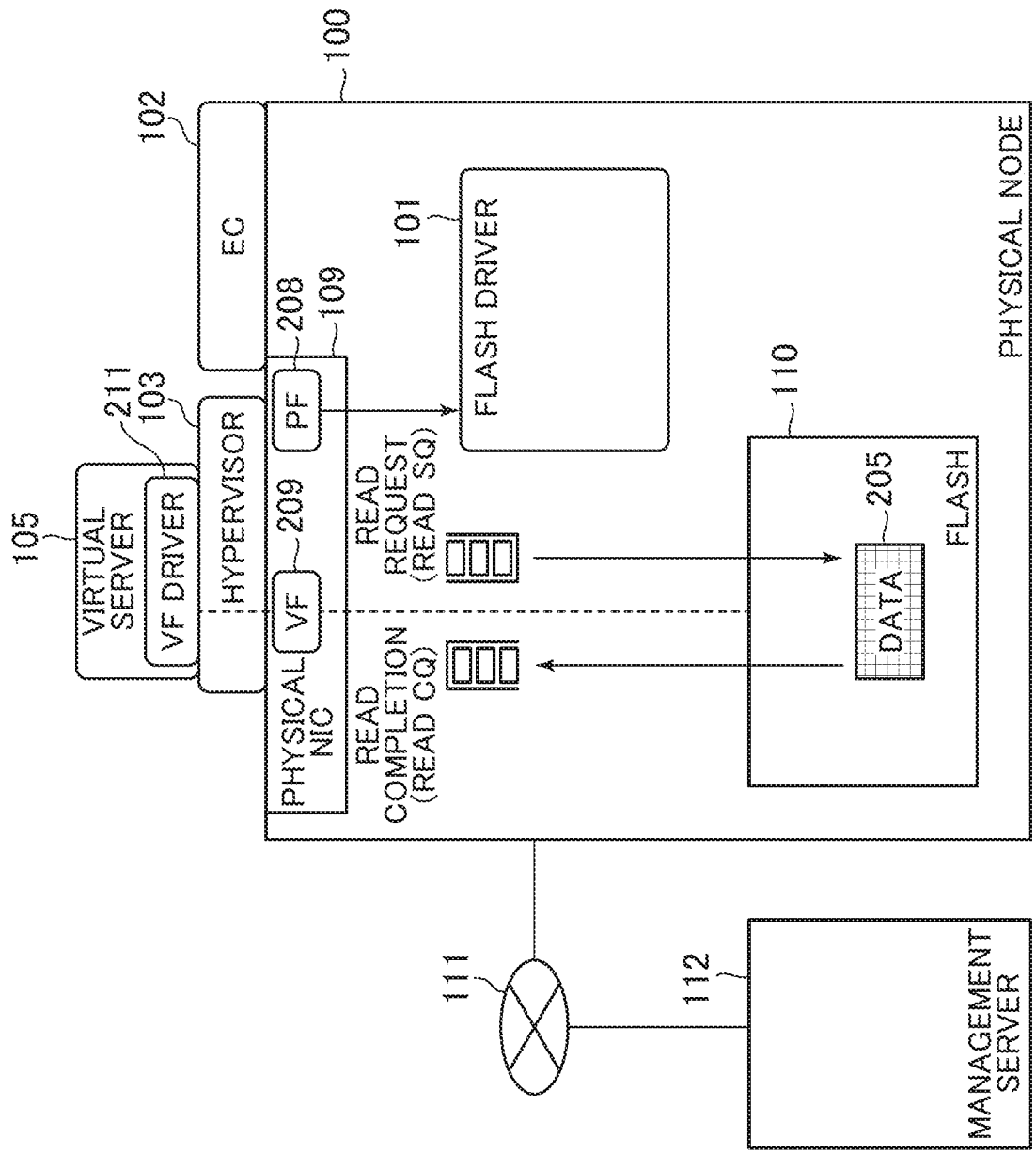
FIG. 5 is a schematic diagram related to read processing performed when a read request occurs in a virtual server according to the first embodiment.

FIG. 5 is a schematic diagram related to read processing performed when a read request is made in the virtual server 105.

As for an I/O request made in the virtual server 105, the VF driver 211 directly transmits the I/O request to the VF 209 without transmitting to the Hypervisor 103. The Flash Driver 101 determines whether the I/O request is a read request or a write request and when the Flash Driver determines that the I/O request is the read request, the VF 209 acquires data to be read from the data area 205 of the Flash 110 correlated with the virtual server 105 by transmitting the read request (Read SQ: a Read Send Queue) to the Flash 110 (issuing a read command) and receiving read completion notice (Read CQ: a Read Complete Queue).

Figure 6:
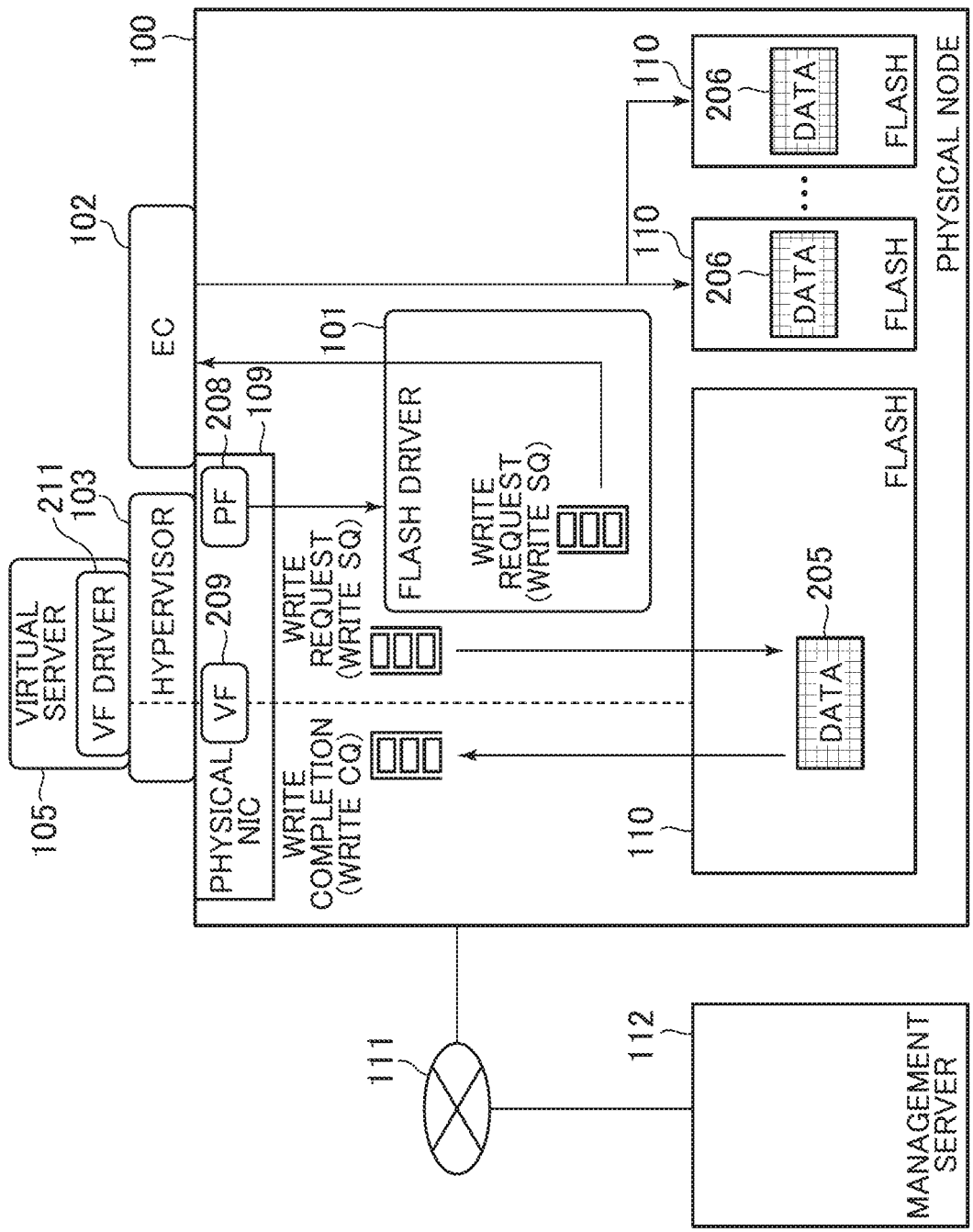
FIG. 6 is a schematic diagram related to write processing performed when a write request occurs in the virtual server according to the first embodiment.

FIG. 6 is a schematic diagram related to write processing performed when a write request is made in the virtual server 105.

As for an I/O request made in the virtual server 105, the VF driver 211 directly transmits the I/O request to the VF 209 without transmitting to the Hypervisor 103. The Flash Driver 101 determines whether the I/O request is a read request or a write request and when the Flash Driver determines that the I/O request is the write request, it determines whether EC processing is executed or not referring to the EC utilization management table 204. When the Flash Driver 101 determines that the EC processing is to be executed, it notifies the EC 102 of the write request, the EC 102 applies EC processing to data to be written and writes data after the EC processing (redundantized data) to the redundantized data area 206 of a predetermined Flash 110.

In addition, when the Flash Driver 101 determines that the I/O request is a write request, the VF 209 writes data to be written to the data area 205 of the Flash 110 correlated with the virtual server 105 by transmitting the write request (Write SQ: a Write Send Queue) (issuing a write command) to the Flash 110 and receiving write completion notice (Write CQ: Write Complete Queue).

Figure 7:
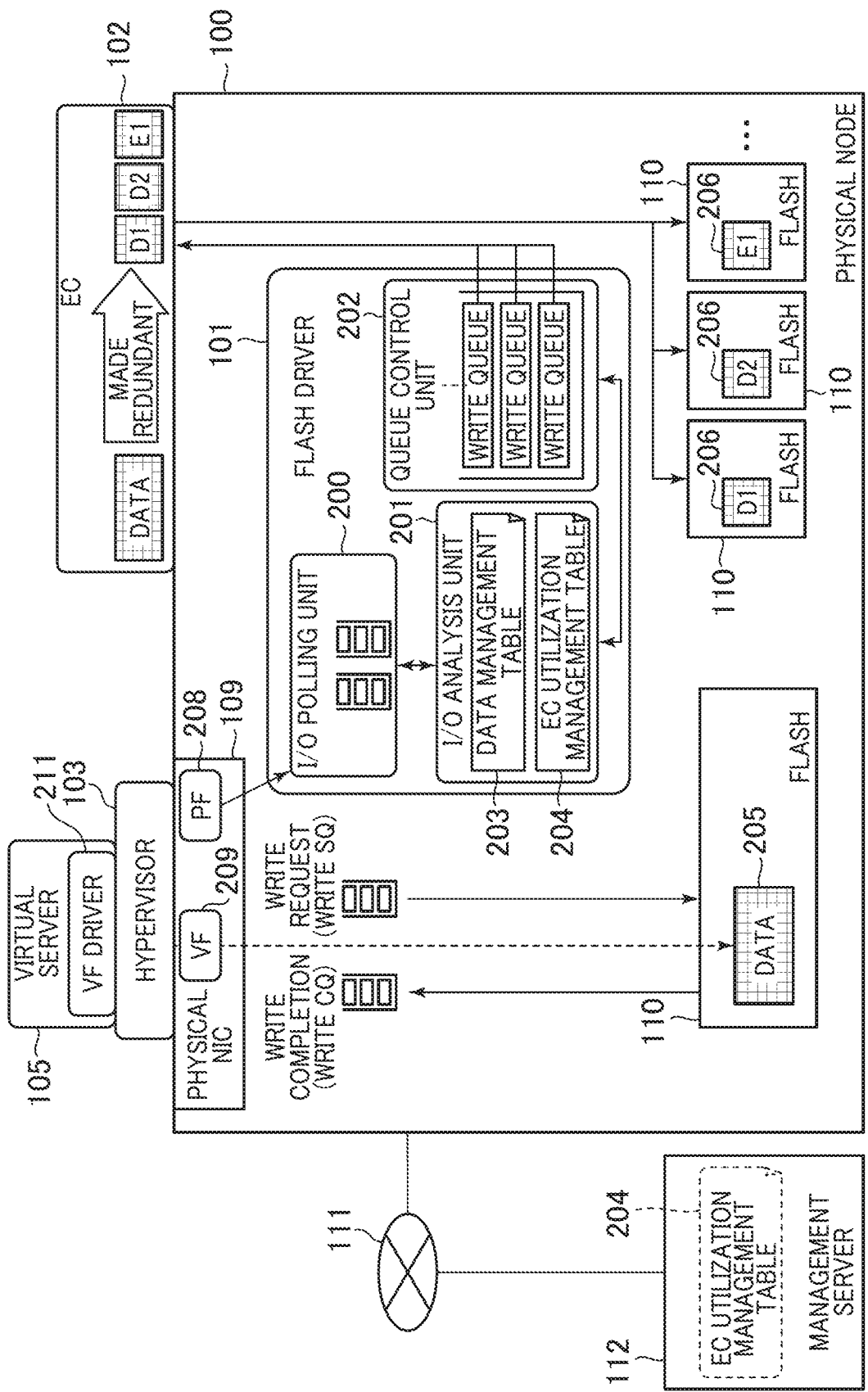
FIG. 7 is a schematic diagram related to details of the write Processing performed when the write request occurs in the virtual server according to the first embodiment.

FIG. 7 is a schematic diagram related to details of write processing performed when a write request is made in the virtual server 105 and especially, is a schematic diagram related to details of processing of the Flash Driver 101.

The I/O polling unit 200 of the Flash Driver 101 polls (monitors) the PF 208 that manages the VF 209 and when the I/O polling unit acquires an I/O request made in the virtual server 105, it notifies the I/O analysis unit 201 of the acquired I/O request.

The I/O analysis unit 201 specifies the Flash 110 being an issuance destination of the I/O request referring to the data management table 203, determines whether the I/O request is a read request or a write request, and when the I/0 analysis unit determines that the I/O request is the write request, it determines whether EC processing is executed or not referring to the EC Flag 406 of the EC utilization management table 204.

When the I/O analysis unit 201 determines that the EC processing is to be executed, it notifies the queue control unit 202 of information of the Flash 110 being the issuance destination of the I/O request.

The queue control unit 202 generates a Write Queue corresponding to the I/O request, enqueues it, when data volume reaches predetermined volume or a Write Queue reaches a predetermined number, the queue control unit generates an interrupt, and transmits a write command to the EC 102.

A configuration that a Write Queue is enqueued by putting plural write requests together so as to execute EC processing is shown; however, the present invention is not limited to this configuration. For example, EC processing may also be executed for every write request without enqueuing write requests. In addition, for example, requests are enqueued for every virtual server 105 and write requests may also be enqueued so that the write requests of the same virtual server 105 are put together and EC processing is executed.

When the EC 102 receives a write command, it executes EC processing, generates one or plural redundantized data (a fragment D1, a fragment D2 and a parity code E1 in this example) and stores the generated redundantized data in the redundantized data area 206 of the Flash 110 having no data area 205. At this time, for the EC processing, the abovementioned technique described in Patent Literature 1 for example can be applied. A part or the whole of redundantized data may also be stored in the Flash 110 having the data area 205.

In addition, when the I/O analysis unit 201 determines that the I/O request is a write request, the VF 209 writes data to be written to the data area 205 of the Flash 110 correlated with the virtual server 105 by transmitting the write request to the Flash 110.

Figure 8:
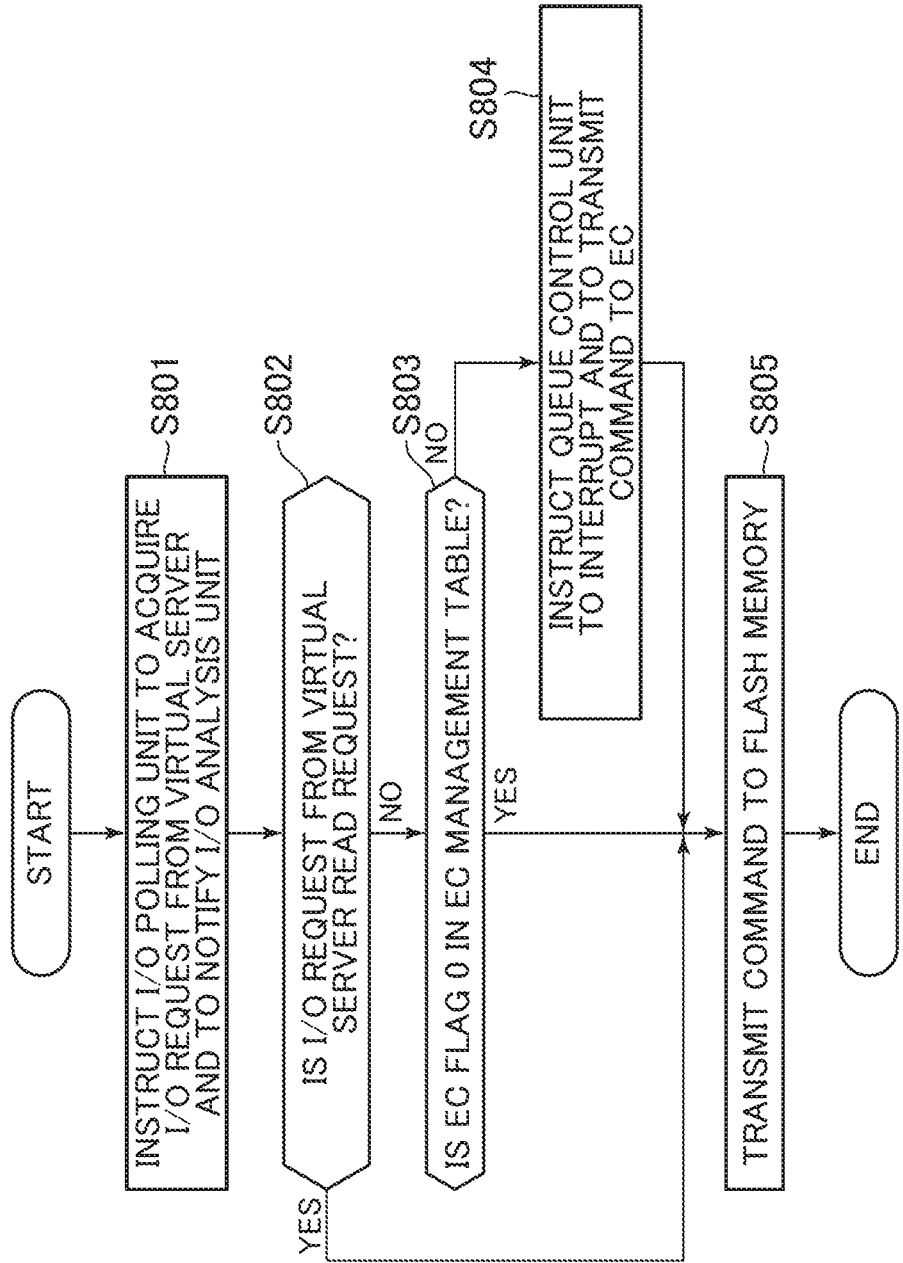
FIG. 8 shows one example of process contents of an EC processing execution propriety determination process according to the first embodiment.

FIG. 8 shows one example of process contents related to an EC processing execution propriety determination process.

First, the I/O polling unit 200 acquires an I/O request from the virtual server 105 and notifies the I/O analysis unit 201 (a step S801).

Next, the I/O analysis unit 201 analyzes packet contents of the I/O request from the virtual server 105 and determines whether the I/O request is a read request or not (a step S802). At this time, when the I/O analysis unit 201 determines that the I/O request is the read request, it transfers control to a step S805 and when the I/O analysis unit determines that the I/O request is not a read request, it transfers control to a step S803.

In the step S803, the I/O analysis unit 201 analyzes the packet contents of the I/O request from the virtual server 105, specifies the virtual server 105, and the I/O analysis unit determines whether the value is 0 or not, referring to a value of the EC Flag 406 in the EC utilization management table 204 corresponding to the virtual server 105. At this time, when the I/O analysis unit 201 determines that the value is 0 (a value showing that no EC processing is executed), it transfers control to the step S805, and when the I/O analysis unit determines that the value is not 0 and is 1 (a value showing that EC processing is to be executed), it transfers control to a step S804.

When a value of the EC Flag 406 is set corresponding to the virtual server 105 and a data access method of the virtual server 105, the I/O analysis unit 201 analyzes packet contents of an I/O request from the virtual server 105, specifies the virtual server 105 and the data access method of the virtual server 105, and the I/O analysis unit refers to a value of the EC Flag 406 corresponding to the virtual server 105 and the data access method of the virtual server 105 in the EC utilization management table 204 for example.

In addition, when a value of the EC Flag 406 is set corresponding to the virtual server 105 and a file path used by the virtual server 105, the I/O analysis unit 201 analyzes packet contents of an I/O request from the virtual server 105, specifies the virtual server 105 and the file path used by the virtual server 105, and the I/O analysis unit refers to a value of the EC Flag 406 corresponding to the virtual server 105 and the file path used by the virtual server 105 in the EC utilization management table 204 for example.

Moreover, when a value of the EC Flag 406 is set corresponding to the virtual server 105, a data access method of the virtual server 105 and a file path used by the virtual server 105, the I/O analysis unit 201 analyzes packet contents of an I/O request from the virtual server 105, specifies the virtual server 105, a data access method of the virtual server 105 and a file path used by the virtual server 105, and the I/O analysis unit refers to a value of the EC Flag 406 corresponding to the virtual server 105, the data access method of the virtual serer 105 and the file path used by the virtual server 105 in the EC utilization management table 204 for example.

In the step S804, the queue control unit 202 generates an interrupt at suitable timing, transmits a write command to the EC 102, and transfers control to the step S805.

In the step S805, the Flash Driver 101 instructs the VF 209 to transmit an I/O command corresponding to the I/O request to the Flash 110 and terminates the I/O processing. More concretely, when the I/O request from the virtual server 105 is a read request, the VF 209 transmits a read command to the Flash 110 being a read destination of data to be read, and when the I/O request from the virtual server 105 is a write request, the VF transmits a write command to the Flash 110 being a write destination of data to be written.

Additionally, the processing in the step S805 is not necessarily required to be executed after the processing in the steps S802 to S804 and the processing in the step S805 may also be executed in asynchronization with processing of the Flash Driver 101 when the VF 209 receives the I/O request from the VF driver 211.

According to the abovementioned embodiment, as in the physical node 100, EC processing can be controlled for every I/O request by analyzing the I/O request in the Flash Driver 101, reducing an overhead by the Hypervisor 103 by off-loading I/O processing on the physical NIC 109, acceleration of I/O processing and redundantization of data can be made compatible.

(2) Second Embodiment

As this embodiment is different from the first embodiment in that data to be written is stored in an intermediate data area 900 as intermediate data in a case that it is determined whether EC processing is executed or not on the basis of a data access method and no EC processing is executed when a virtual server 105 requests to write data, the point will be mainly described below.

Figure 9:
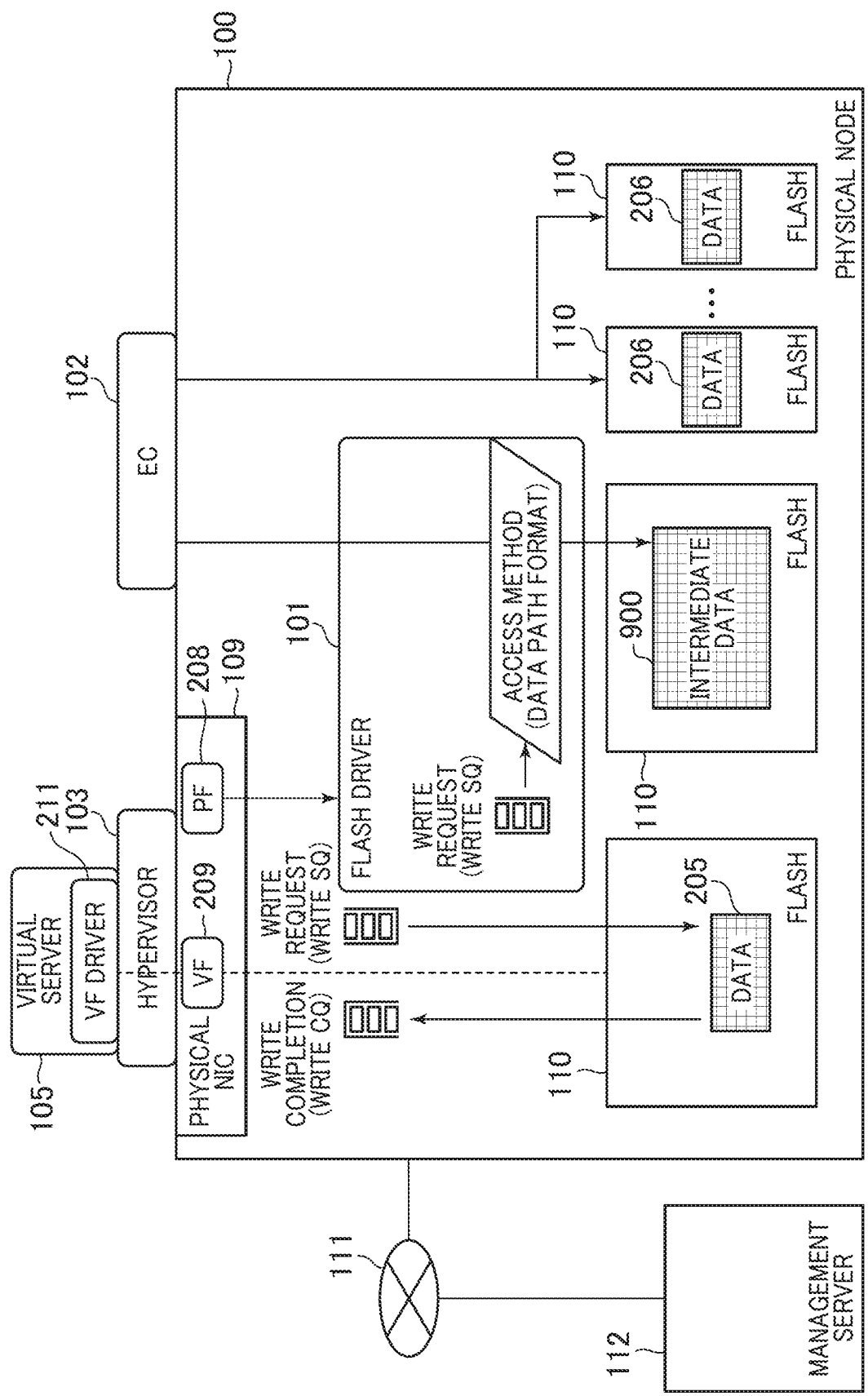
FIG. 9 is a schematic diagram related to write processing performed when a write request occurs in a virtual server according to a second embodiment.

FIG. 9 is a schematic diagram related to write processing performed when the virtual server 105 requests to write data.

As for an I/O request made in the virtual server 105, a VF driver 211 directly transmits the I/O request to VF 209 without transmitting to Hypervisor 103.

In this case, when Flash Driver 101 acquires the I/O request made in the virtual server 105, it determines whether EC processing is executed or not, referring to an EC utilization management table 204. More concretely, the Flash Driver 101 determines whether a data access method of the virtual server 105 is a data access method specified as an EC execution condition or not.

When the Flash Driver 101 determines that the data access method of the virtual server 105 is the data access method specified as the EC execution condition, it transmits a write command to EC 102 so as to execute EC processing. In addition, the VF 209 writes data to be written to a data area 205 of a Flash 110 correlated with the virtual server 105 by transmitting a write request to the Flash 110.

In the meantime, when the Flash Driver 101 determines that the data access method of the virtual server 105 is the data access method unspecified as the EC execution condition, it writes data to be written to the intermediate data area 900 as intermediate data by transmitting a write command to a Flash 110 having the intermediate data area 900 provided corresponding to the virtual server 105 for writing data to be written as intermediate data without instructing to execute EC processing.

Though details are described later, it is determined whether EC processing is executed or not using a data path format in place of the data access method in a third embodiment and in a fourth embodiment, it is determined whether EC processing is executed or not using a data path format in place of the data access method.

Figure 10:
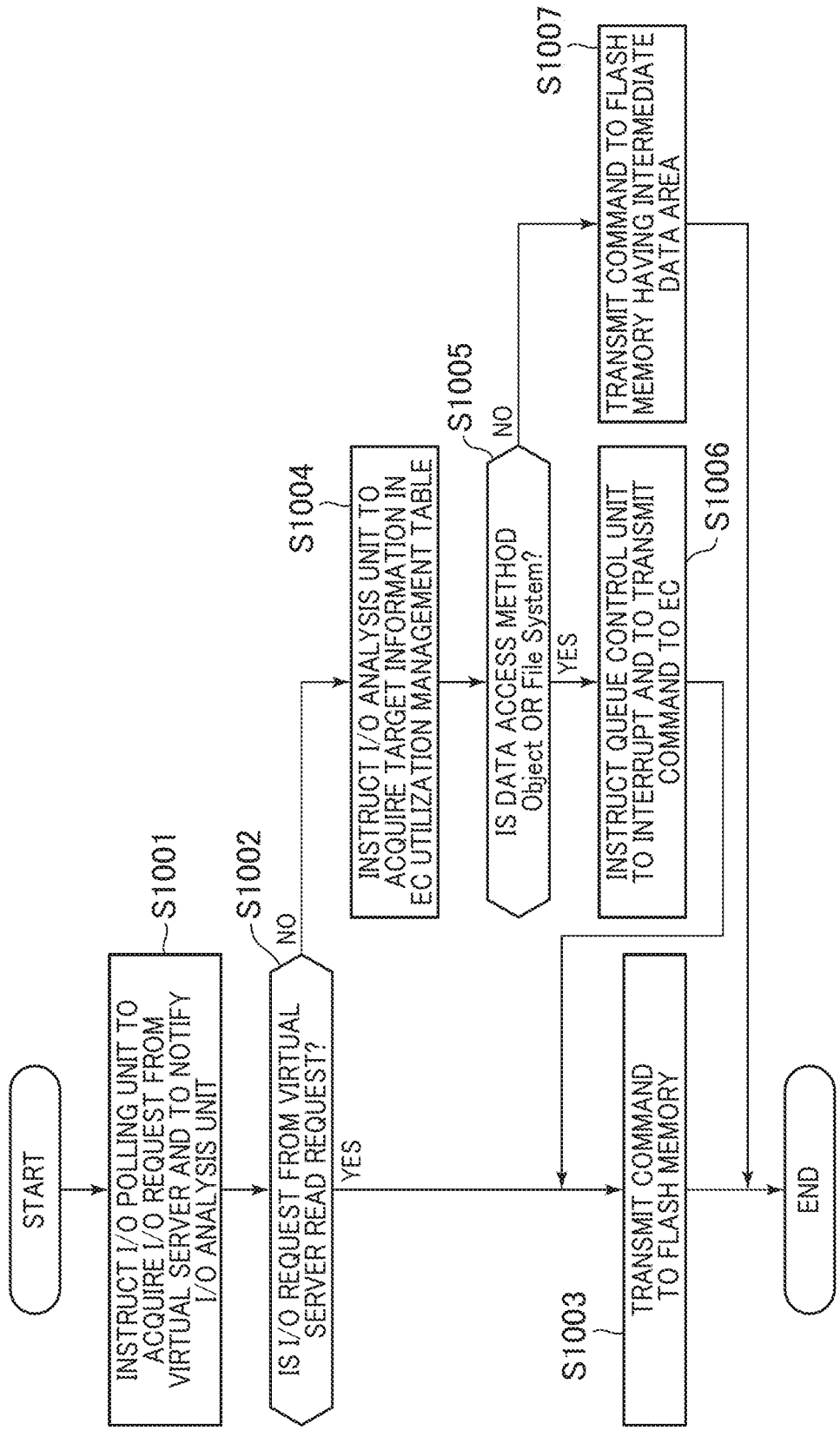
FIG. 10 shows one example of process contents of an EC processing execution propriety determination process according to the second embodiment.

FIG. 10 shows one example of process contents related to an EC processing execution propriety determination process. As steps S1001 to S1003 and a step S1006 are the similar processing to the steps S801, S802, S804 and S805, the description is omitted.

In a step S1004, an I/O analysis unit 201 analyzes an I/O request, specifies a virtual server 105, and acquires target information, more concretely a value of Data Access Method 404 corresponding to a virtual server 105 (for the value, only one may be set and plural ones may be set) from the EC utilization management table 204 that stores information in which at least a virtual server 105 and a data access method are correlated.

Next, the I/O analysis unit 201 analyzes the I/O request, specifies a data access method of the virtual server 105, and determines whether or not the data access method of the virtual server 105 is a data access method specified (set) that EC processing is to be executed (the value acquired in the step S1004: "Object" or "File System" in this example) (a step S1005). At this time, when the I/O analysis unit 201 determines that the data access method of the virtual server is the data access method specified that EC processing is to be executed, it transfers control to the step S1006, and when the I/O analysis unit determines that the data access method of the virtual server is not the data access method specified that EC processing is to be executed, it transfers control to a step S1007.

In the step S1007, a queue control unit 202 transmits a write command to a Flash 110 having an intermediate data area 900 provided corresponding to the virtual server 105 for writing data to be written as intermediate data and terminates the process.

The Flash 110 having the intermediate data area 900 may also be decided using information which is stored in a predetermined area of a memory 106 and which correlates a virtual server 105 and an intermediate data area 900, a Flash being an issuance destination of the I/O request is specified on the basis of a data management table 203, a Flash 110 except the specified Flash 110 may also be decided, and the Flash having the intermediate data area may also be decided by the other method.

According to the abovementioned this embodiment, as the effects of the first embodiment are produced and EC processing can be controlled every data access method of the virtual server 105, data requiring EC processing (data to be written as actual data) and data not requiring it (intermediate data to be temporarily stored as data for analysis and others) are discriminated on the basis of the data access method and redundantization of data can be performed. Further, according to the abovementioned this embodiment, data requiring EC processing and data not requiring it are discriminated on the basis of the data access method of the virtual server 105 and can be stored in different flash memories 110.

(3) Third Embodiment

As this embodiment is different from the first embodiment in that it is determined whether EC processing is executed or not on the basis of a data path when writing is requested and data to be written is stored in an intermediate data area 900 as intermediate data when no EC processing is executed, the point will be mainly described below.

Figure 11:
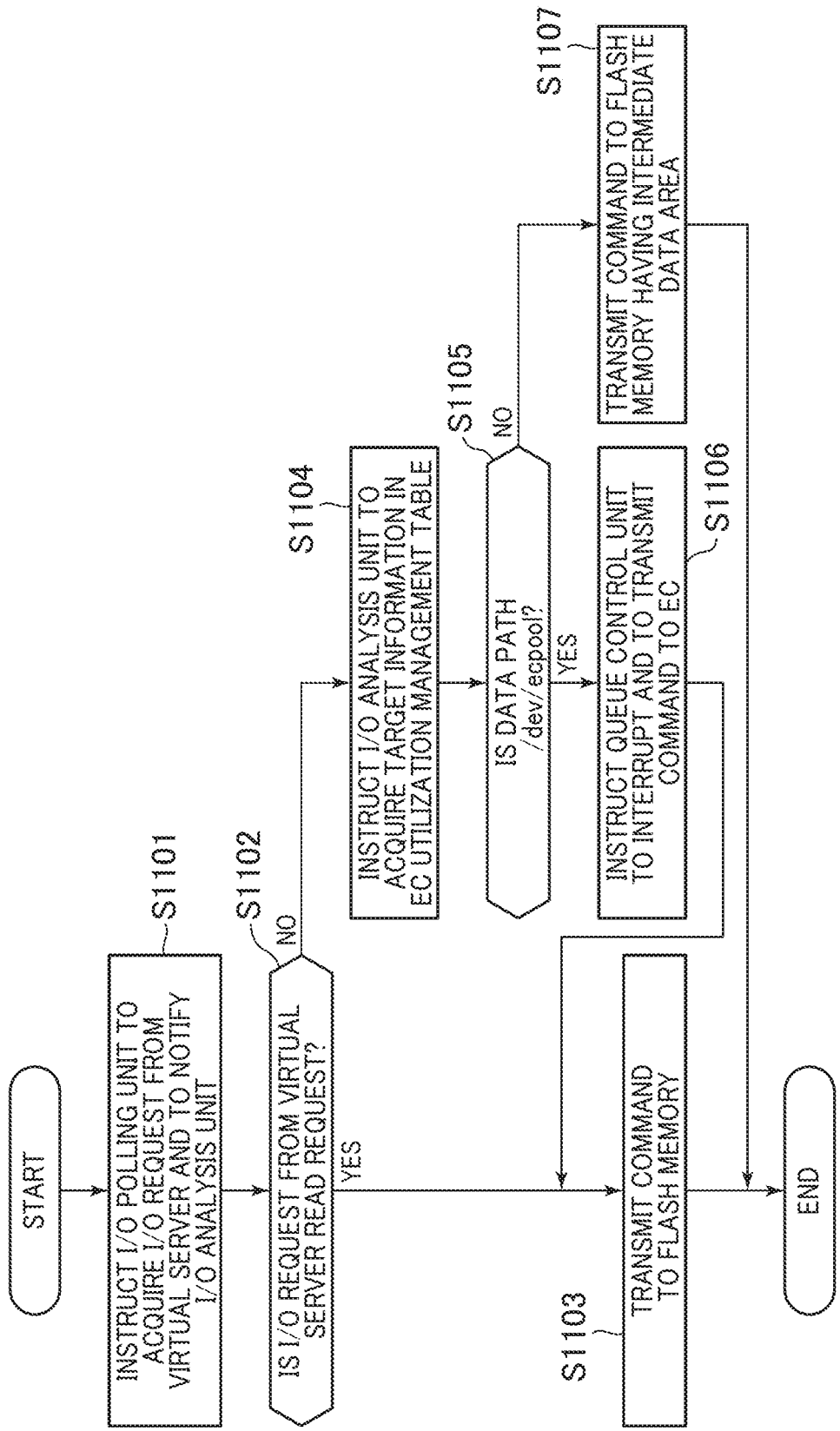
FIG. 11 shows one example of process contents of an EC processing execution propriety determination process according to a third embodiment.

FIG. 11 shows one example of process contents of an EC processing execution propriety determination process. As steps S1101 to S1103 and a step S1106 are the similar processing to the steps S801, S802, S804 and S805, the description is omitted.

In a step S1104, an I/O analysis unit 201 analyzes an I/O request, specifies a virtual server 105, and acquires target information, more concretely a value of Data Path 405 corresponding to the virtual server 105 (for the value, only one may be set and plural ones may be set) from an EC utilization management table 204 that stores information in which at least a virtual server 105 and a data path are correlated.

Next, the I/O analysis unit 201 analyzes the I/O request, specifies a data path used by the virtual server 105, and determines whether or not the data path used by the virtual server 105 is a data path specified (set) that EC processing is to be executed (the value acquired in the step S1104: "/dev/ecpool" in this example) (a step S1105). At this time, when the I/0 analysis unit 201 determines that the data path used by the virtual server is the data path specified that EC processing is to be executed, it transfers control to the step S1106 and when the I/O analysis unit determines that the data path used by the virtual server is not the data path specified that EC processing is to be executed, it transfers control to a step S1107.

In the step S1107, a queue control unit 202 transmits a write command to a Flash 110 having an intermediate data area 900 provided corresponding to the virtual server 105 for writing data to be written as intermediate data and terminates the process.

According to the abovementioned this embodiment, as the effects of the first embodiment are produced and EC processing can be controlled for every data path used by the virtual server 105, data requiring EC processing (data to be written as actual data) and data not requiring it (intermediate data to be temporarily stored as data for analysis and others) are discriminated on the basis of the data path and redundantization of data can be performed. Further, according to the abovementioned this embodiment, data requiring EC processing and data not requiring it are discriminated on the basis of the data path used by the virtual server 105 and can be stored in different flash memories 110.

(4) Fourth Embodiment

As this embodiment is different from the first embodiment in that it is determined whether EC processing is executed or not on the basis of a data access method of a virtual server 105 and a data path used by the virtual server 105 when writing is requested and data to be written is stored in an intermediate data area 900 as intermediate data when EC processing is not executed, the point will be mainly described below.

Figure 12:
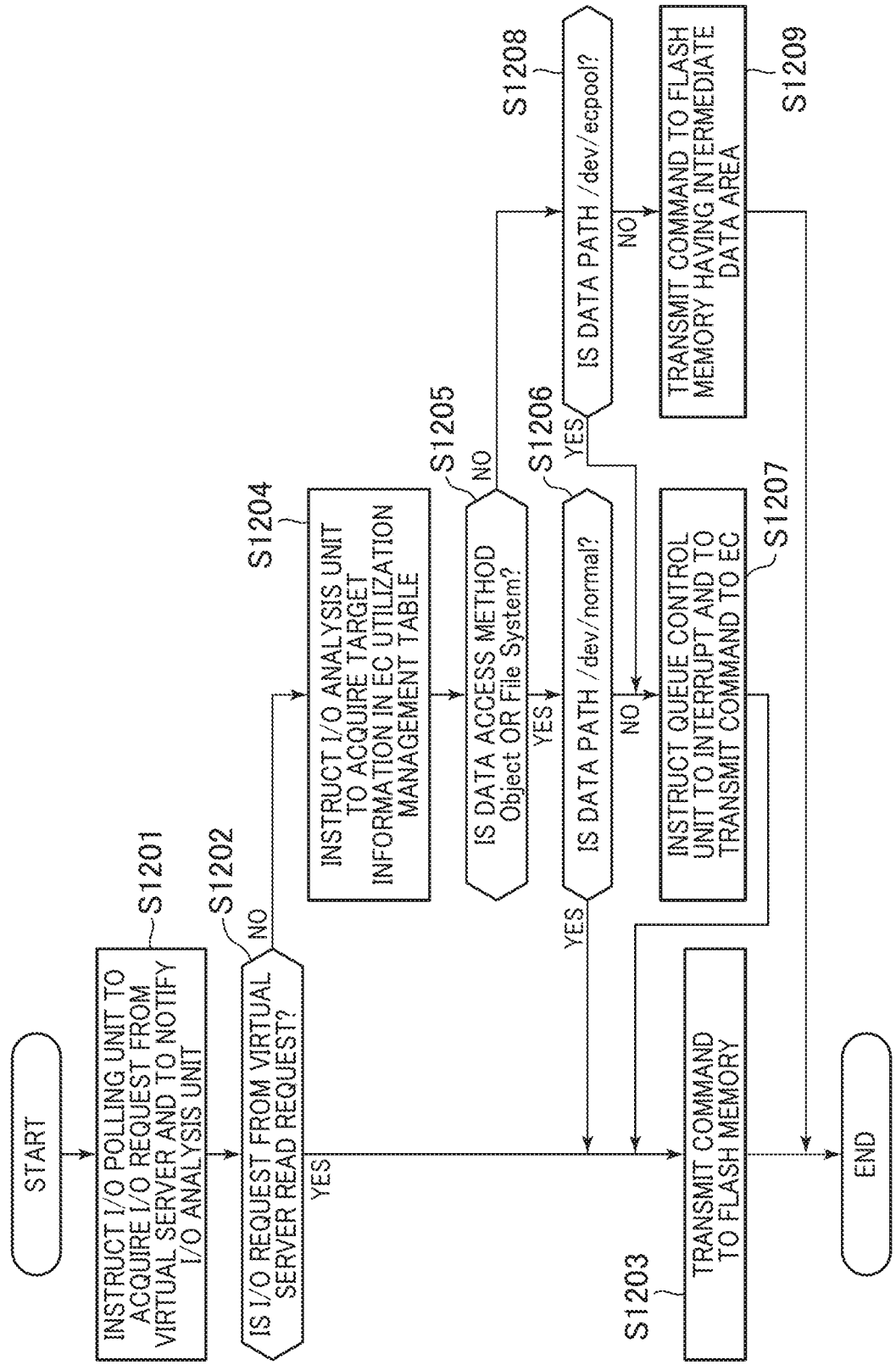
FIG. 12 shows one example of process contents of an EC processing execution propriety determination process according to a fourth embodiment.

FIG. 12 shows one example of process contents related to an EC processing execution propriety determination process. As steps S1201 to S1203 and a step S1207 are the similar processing to the steps S801, S802, S804 and S805, the description is omitted.

Ina step S1204, an I/O analysis unit 201 analyzes an I/O request, specifies a virtual server 105, and acquires target information, more concretely a value of Data Access Method 404 corresponding to the virtual server 105 and a value of Data Path 405 corresponding to the virtual server 105 from an EC utilization management table 204 that stores information in which at least a virtual server 105, a data access method and a data path are correlated.

Next, the I/O analysis unit 201 analyzes the I/O request, specifies a data access method of the virtual server 105, and determines whether or not the data access method of the virtual server 105 is a data access method specified (set) that EC processing is to be executed (the value acquired in the step S1204: "Object" or "File System" in this example) (a step S1205). At this time, when the I/O analysis unit 201 determines that the data access method of the virtual server is the data access method specified that EC processing is to be executed, it transfers control to a step S1206 and when the I/O analysis unit determines that the data access method of the virtual server is not the data access method specified that EC processing is to be executed, it transfers control to a step S1208.

In the step S1206, the I/O analysis unit 201 analyzes the I/O request, specifies a data path used by the virtual server 105, and determines whether or not the data path used by the virtual server 105 is a data path specified (set) that no EC processing is executed ("/dev/normal" in this example). At this time, when the I/O analysis unit 201 determines that the data path used by the virtual server is the data path specified that no EC processing is executed, it transfers control to the step S1203 and when the I/O analysis unit determines that the data path used by the virtual server is not the data path specified that no EC processing is executed, it transfers control to the step S1207.

In a step S1208, the I/O analysis unit 201 analyzes the I/O request, specifies the data path used by the virtual server 105, and determines whether or not the data path used by the virtual server 105 is a data path specified (set) that EC processing is to be executed (the value acquired in the step S1204: "/dev/ecpool" in this example). At this time, when the I/O analysis unit 201 determines that the data path used by the virtual server is the data path specified that EC processing is to be executed, it transfers control to the step S1207 and when the I/O analysis unit determines that the data path used by the virtual server is not the data path specified that EC processing is to be executed, it transfers control to a step S1209.

In the step S1209, a queue control unit 202 transmits a write command to a Flash 110 having the intermediate data area 900 provided corresponding to the virtual server 105 for writing data to be written as intermediate data and terminates the process.

According to the abovementioned this embodiment, as the effects of the first embodiment are produced and EC processing can be controlled for every data access method of the virtual server 105 and every data path used by the virtual server 105, data requiring EC processing (data to be written as actual data) and data not requiring it (intermediate data to be temporarily stored as data for analysis and others) are discriminated in detail on the basis of the data access method and the data path and redundantization of data can be performed. Further, according to the abovementioned this embodiment, data requiring EC processing and data not requiring it are discriminated on the basis of the data access method of the virtual server 105 and the data path used by the virtual server 105 and can be stored in different flash memories 110.

(5) Fifth Embodiment

In this embodiment, a point that the information in the EC utilization management table 204 in the abovementioned embodiments is set via a management screen will be described.

Figure 13:
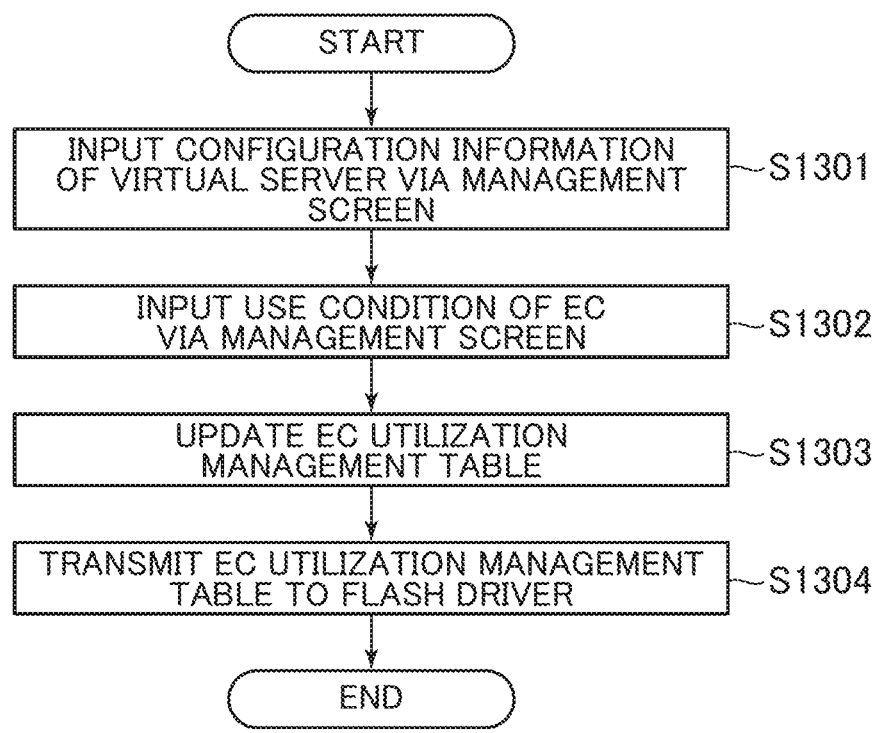
FIG. 13 shows one example of process contents of an EC processing execution propriety setting process according to a fifth embodiment.

FIG. 13 shows one example of process contents related to an EC processing execution propriety setting process in a management server 112.

First, the management server 112 inputs configuration information of a virtual server 105 (information related to virtual resources) on the basis of operation (user operation) of an input device (not shown) by a user via a management screen (for example, a setting screen 1400 of the virtual server 105 shown in FIG. 14) (a step S1301).

Next, the management server 112 inputs a utilization condition of EC 102 (information for enabling identifying whether EC processing is executed or not) on the basis of user operation via the management screen (a step S1302).

Next, the management server 112 stores (updates) an EC utilization management table 204 in a storage device (not shown) (a step S1303).

Next, the management server 112 transmits the EC utilization management table 204 to a physical node 100 (Flash Driver 101) (a step S1304) and terminates the process.

When the EC utilization management table 204 stored in the management server 112 is updated or when a configuration that the EC utilization management table 204 is updated by the physical node 100 is adopted, the management server 112 acquires the latest EC utilization management table 204 before the step S1301.

FIG. 14 shows one example (the setting screen 1400 of the virtual server 105) of the management screen for managing the configuration information of the virtual server 105 and the utilization condition of the EC 102.

As shown in FIG. 14, for the configuration information of the virtual server 105, information of a VM name, the number of CPU cores and memory capacity can be input (can be set) on the setting screen 1400.

In addition, on the setting screen 1400, for the configuration information of the virtual server 105, allocation of a device (allocation of a Flash 110) is performed and a device name such as "/dev/ecpool0" and "/dev/normal0" can be input for every device such as "/dev/sda" and "/dev/sdb". At this time, a user inputs the device name to correspond to a data path.

Moreover, on the setting screen 1400, for an EC execution condition, each information of use of EC for deciding whether EC processing is utilized or not in the virtual server 105, a data access method for specifying an object for the EC processing to be executed and a data path for specifying the object for the EC processing to be executed can be input. For example, when EC processing is to be executed in the virtual server 105, each input field of the data access method and the data path is displayed by checking "USE EC" and a desired condition can be set.

According to this embodiment, as the effects of the abovementioned embodiments are produced and the information for determining whether the EC processing is executed or not is displayed on the management screen, a user can easily perform the setting related to the EC processing.

(6) Other Embodiments

In the abovementioned first to fifth embodiments, the case that the present invention is applied to the I/O control system 1 has been described; however, the present invention is not limited to this case and can be widely applied to other various I/O control systems.

In addition, in the abovementioned first to fifth embodiments, for the virtual environment of the physical node 100, various virtual environment such as a hypervisor type, a host OS type and a KVM type can be applied.

Moreover, in the abovementioned first to fifth embodiments, the case that the Flash Driver 101 is provided to the memory 106 has been described; however, the present invention is not limited to this case, a flash driver 101 as a circuit and others may also be provided to the physical NIC 109.

In addition, in the abovementioned first to fifth embodiments, the case that the I/O request is acquired by the I/O polling unit 200 has been described; however, the present invention is not limited to this case, an I/O receiver that receives an I/O request every time the I/O request is issued is provided to the physical node 100, and the I/O request may also be acquired by the I/O receiver. The I/O receiver may also be realized by software and may also be realized by hardware.

Further, in the abovementioned first to fifth embodiments, the case that the PF 208 manages the VF 209 and the I/O polling unit 200 polls the PF 208 has been described; however, the present invention is not limited to this case, and the I/O polling unit 200 may also poll hardware different from the FP 208 that manages the VF 209.

Furthermore, in the abovementioned first to fifth embodiments, the case that redundantized data is stored in one physical node has been described; however, the present invention is not limited to this case, and redundantized data may also be stored in one or plural separate physical nodes.

Furthermore, in the abovementioned fifth embodiment, the case that the management server 112 inputs the configuration information of the virtual server 105 and the utilization condition of the EC 102 has been described; however, the present invention is not limited to this case, the management server 112 inputs configuration information of the virtual server 105 and the physical node 100 (for example, the Flash Driver 101) may also input a utilization condition of the EC 102 on the basis of the configuration information.

LIST OF REFERENCE SIGNS

1—Input-output control system, 100—Physical node, 101—Flash Driver, 102—EC, 103—Hypervisor, 104—Guest OS,105 —Virtual server, 106—Memory, 107—Chip Set, 108—CPU, 109—Physical NIC, 110—Flash memory, 111—Network, 112—Management server

The invention claimed is:

1. An I/O control method of performing control related to an I/O request from a virtual machine operated in a computer provided with an I/O device that executes I/O processing, comprising steps of:
  a first step in which an I/O analysis unit determines whether or not data redundantization processing related to the I/O request is executed on the basis of the I/O request from the virtual machine and setting information that enables identifying whether or not the data redundantization processing is executed; and
  a second step in which a control unit transmits an I/O command related to the I/O request to a data redundantization mechanism that executes the data redundantization processing on the basis of a determination result in the first step;

wherein the setting information is information acquired by correlating the propriety of executing the data redundantization processing and a data path used by the virtual machine, and the I/O analysis unit determines whether or not the data redundantization processing related to the I/O request from the virtual machine is executed on the basis of the I/O request from the virtual machine, the setting information and the data path used by the virtual machine.

2. The I/O control method according to claim 1, wherein the setting information is information acquired by correlating propriety of executing the data redundantization processing and a data access method of the virtual machine, and the I/O analysis unit determines whether or not the data redundantization processing related to the I/O request from the virtual machine is executed on the basis of the I/O request from the virtual machine, the setting information and the data access method of the virtual machine.

3. The I/O control method according to claim 1, wherein the setting information is information acquired by also correlating a data access method of the virtual machine, and the I/O analysis unit determines whether or not the data redundantization processing related to the I/O request from the virtual machine is executed on the basis of the I/O request from the virtual machine, the setting information, the data access method of the virtual machine and the data path used by the virtual machine.

4. The I/O control method according to claim 1, further comprising:

a third step in which a management device inputs the setting information; and a fourth step in which the management device transmits the setting information to the computer.

5. An I/O control method of performing control related to an I/O request from a virtual machine operated in a computer provided with an I/O device that executes I/O processing, comprising steps of:

a first step in which an I/O analysis unit determines whether or not data redundantization processing related to the I/O request is executed on the basis of the I/O request from the virtual machine and setting information that enables identifying whether or not the data redundantization processing is executed; and a second step in which a control unit transmits an I/O command related to the I/O request to a data redundantization mechanism that executes the data redundantization processing on the basis of a determination result in the first step;

wherein the I/O device is a physical NIC (physical Network Interface Card) corresponding to SR-IOV (Single Root I/O Virtualization), the data redundantization mechanism is EC (Erasure Coding);

the setting information is information acquired by correlating the propriety of executing the data redundantization processing by the EC, a data access method of the virtual machine and a data path used by the virtual machine, an I/O polling unit acquires the I/O request from the virtual machine, the I/O analysis unit determines whether the I/O request acquired by the I/O polling unit is a read request or a write request, determines whether or not the data access method of the virtual machine is a data access method correlated with the execution of the data redundantization processing by the EC when the I/O analysis unit determines that the I/O request is the write request, determines whether or not the data path used by the virtual machine is a data path uncorrelated with the execution of the data redundantization processing by the EC when the I/O analysis unit determines that the data access method of the virtual machine is the data access method correlated with the execution of the data redundantization processing by the EC, and determines whether or not the data path used by the virtual machine is the data path correlated with the execution of the data redundantization processing by the EC when the I/O analysis unit determines that the data access method of the virtual machine is not the data access method correlated with the execution of the data redundantization processing by the EC, the control unit transmits a write command to the EC and instructs the I/O device to transmit the write command related to the write request to a storage device when the I/O analysis unit determines that the I/O request is a write request, determines that the data access method of the virtual machine is the data access method correlated the execution of the data redundantization processing by the EC and determines that the data path used by the virtual machine is not a data path uncorrelated with the execution of the data redundantization processing by the EC or when the I/O analysis unit determines that the data access method of the virtual machine is not the data access method correlated with the execution of the data redundantization processing by the EC and determines that the data path of the virtual machine is the data path correlated with the execution of the data redundantization processing by the EC, and the control unit transmits a write command to a storage device different from the storage device when the I/O analysis unit determines that the data access method of the virtual machine is not the data access method correlated with the execution of the data redundantization processing by the EC and determines that the data path of the virtual machine is not the data path correlated with the execution of the data redundantization processing by the EC.

6. An I/O control system that performs control related to an I/O request from a virtual machine operated in a computer provided with an I/O device that executes I/O processing, comprising:

an I/O analysis unit that determines whether or not data redundantization processing related to the I/O request is executed on the basis of the I/O request from the virtual machine and setting information for enabling identifying whether or not the data redundantization processing is executed; and a control unit that transmits an I/O command related to the I/O request to a data redundantization mechanism for executing the data redundantization processing on the basis of a determination result of the I/O analysis unit;

wherein the setting information is information acquired by correlating the propriety of executing the data redundantization processing and a data path used by the virtual machine, and the I/O analysis unit determines whether or not the data redundantization processing related to the I/O request from the virtual machine is executed on the basis of the I/O request from the virtual machine, the setting information and the data path used by the virtual machine.

7. The I/O control system according to claim 6, wherein the setting information is information acquired by correlating the propriety of executing the data redundantization processing and a data access method of the virtual machine, and
the I/O analysis unit determines whether or not the data redundantization processing related to the I/O request from the virtual machine is executed on the basis of the I/O request from the virtual machine, the setting information and the data access method of the virtual machine.

8. The I/O control system according to claim 6, wherein the setting information is information also acquired by correlating a data access method of the virtual machine, and
the I/O analysis unit determines whether or not the data redundantization processing related to the I/O request from the virtual machine is executed on the basis of the I/O request from the virtual machine, the setting information, the data access method of the virtual machine and the data path used by the virtual machine.

9. The I/O control system according to claim 6, further comprising a management device that inputs the setting information,
wherein the management device transmits the setting information to the computer.

10. An I/O control system that performs control related to an I/O request from a virtual machine operated in a computer provided with an I/O device that executes I/O processing, comprising:
an I/O analysis unit that determines whether or not data redundantization processing related to the I/O request is executed on the basis of the I/O request from the virtual machine and setting information for enabling identifying whether or not the data redundantization processing is executed; and
a control unit that transmits an I/O command related to the I/O request to a data redundantization mechanism for executing the data redundantization processing on the basis of a determination result of the I/O analysis unit;
wherein the I/O device is a physical NIC(physical Network Interface Card) corresponding to SR-IOV (Single Root I/O Virtualization),
the data redundantizationmechanism is EC (Erasure Coding); and
the setting information is information acquired by correlating the propriety of executing the data redundantization processing by the EC, a data access method of the virtual machine and a data path used by the virtual machine, the I/O control system further comprising an I/O polling unit that acquires the I/O request from the virtual machine,
wherein the I/O analysis unit determines or not whether the I/O request acquired by the I/O polling unit is a read request or a write request, determines whether a data access method of the virtual machine is a data access method correlated with the execution of the data redundantizationprocessing by the EC when the I/O analysis unit determines that the I/O request is the write request, determines whether or not a data path used by the virtual machine is a data path uncorrelated with the execution of the data redundantization processing by the EC when the I/O analysis unit determines that the data access method of the virtual machine is the data access method correlated with the execution of the data redundantizationprocessing by the EC, and determines whether or not the data path used by the virtual machine is the data path correlated with the execution of the data redundantization processing by the EC when the I/O analysis unit determines that the data access method of the virtual machine is not the data access method correlated with the execution of the data redundantization processing by the EC,
the control unit transmits a write command to the EC and instructs the I/O device to transmit the write command related to the write request to a storage device when the I/O analysis unit determines that the I/O request is the write request, determines that the data access method of the virtual machine is the data access method correlated with the execution of the data redundantization processing by the EC and determines that the data path used by the virtual machine is not the data path uncorrelated with the execution of the data redundantization processing by the EC or when the I/O analysis unit determines that the data access method of the virtual machine is not the data access method correlated with the execution of the data redundantization processing by the EC and determines that the data path of the virtual machine is the data path correlated with the execution of the data redundantization processing by the EC, and the control unit transmits a write command to a storage device different from the storage device when the I/O analysis unit determines that the data access method of the virtual machine is not the data access method correlated with the execution of the data redundantization processing by the EC and determines that the data path of the virtual machine is not the data path correlated with the execution of the data redundantization processing by the EC.

* * * * *